(12) United States Patent
Terauchi

(10) Patent No.: US 8,041,880 B2
(45) Date of Patent: Oct. 18, 2011

(54) FLASH MEMORY, MEMORY CONTROL CIRCUIT, MICROCOMPUTER AND MEMORY CONTROL METHOD

(75) Inventor: Youji Terauchi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 470 days.

(21) Appl. No.: 11/641,733

(22) Filed: Dec. 20, 2006

(65) Prior Publication Data

US 2007/0140007 A1    Jun. 21, 2007

(30) Foreign Application Priority Data

Dec. 21, 2005    (JP) .................................. 2005-368634

(51) Int. Cl.
*G06F 12/00*    (2006.01)
(52) U.S. Cl. ................. 711/103; 711/E12.069
(58) Field of Classification Search .................. 711/103; 703/28
See application file for complete search history.

(56) References Cited

U.S. PATENT DOCUMENTS

| | | | |
|---|---|---|---|
| 6,529,418 B2 * | 3/2003 | Nakai et al. | 365/189.04 |
| 6,614,685 B2 * | 9/2003 | Wong | 365/185.11 |
| 7,509,474 B2 * | 3/2009 | Wong | 711/206 |
| 7,728,872 B2 * | 6/2010 | Silverbrook et al. | 348/207.2 |
| 2003/0163663 A1 * | 8/2003 | Aasheim et al. | 711/202 |

FOREIGN PATENT DOCUMENTS

| | | |
|---|---|---|
| JP | 3-92941 (A) | 4/1991 |
| JP | 6-139140 (A) | 5/1994 |
| JP | 11-338992 (A) | 12/1999 |
| JP | 2003-288257 (A) | 10/2003 |
| JP | 2006-40264 (A) | 2/2006 |

OTHER PUBLICATIONS

Application Note U17057JJ3V0AN00, (the third edition, NEC Electronics Corporation, Nov. 2004, pp. 25-27.

* cited by examiner

*Primary Examiner* — Reginald Bragdon
*Assistant Examiner* — Hamdy Ahmed
(74) *Attorney, Agent, or Firm* — Foley & Lardner LLP

(57) ABSTRACT

A flash memory includes a data area in which first and second k-bit data (k is a natural number) are stored; and an additional data area in which a first additional m-bit data (m is a natural number) and a second additional m-bit data used to respectively identify the first and second data are stored. The first additional data and the second additional data have different values.

27 Claims, 17 Drawing Sheets

Fig. 5 PRIOR ART

| SEARCH DIRECTION | ADDRESS | | |
|---|---|---|---|
| ↓ | FFFFH | FFH | |
| | FFFEH | FFH | |
| | FFFDH | FFH | |
| | FFFCH | FFH | |
| | ... | ... | |
| | 001BH | FFH | |
| | 001AH | FFH | |
| | 0019H | FFH | |
| | 0018H | FFH | |
| | 0017H | FFH | ⎫ |
| | 0016H | DATA_4 | |
| | 0015H | DATA_3 | ON WRITE OF DATA GROUP 1 |
| | 0014H | DATA_2 | |
| | 0013H | DATA_1 | |
| | 0012H | DATA_0 | ⎭ |
| | 0011H | ID=2 | ⎫ |
| | 0010H | DATA_4 | |
| | 000FH | DATA_3 | DATA GROUP 2 |
| | 000EH | DATA_2 | |
| | 000DH | DATA_1 | |
| | 000CH | DATA_0 | ⎭ |
| | 000BH | ID=1 | ⎫ |
| | 000AH | DATA_4 | |
| | 0009H | DATA_3 | DATA GROUP 1 |
| | 0008H | DATA_2 | |
| | 0007H | DATA_1 | |
| | 0006H | DATA_0 | ⎭ |
| | 0005H | ID=0 | ⎫ |
| | 0004H | DATA_4 | |
| | 0003H | DATA_3 | DATA GROUP 0 |
| | 0002H | DATA_2 | |
| | 0001H | DATA_1 | |
| | 0000H | DATA_0 | ⎭ |

Fig. 6 PRIOR ART

| SEARCH DIRECTION | ADDRESS | | |
|:---:|:---|:---:|:---|
| ↓ | FFFFH | FFH | |
| | FFFEH | FFH | |
| | FFFDH | FFH | |
| | FFFCH | FFH | |
| | ⋮ | ⋮ | |
| | 001BH | FFH | |
| | 001AH | FFH | |
| | 0019H | FFH | |
| | 0018H | FFH | |
| | 0017H | ID=1 | ⎫ |
| | 0016H | DATA_4 | ⎪ |
| | 0015H | DATA_3 | ⎬ END OF WRITE INTO DATA GROUP 1 |
| | 0014H | DATA_2 | ⎪ |
| | 0013H | DATA_1 | ⎪ |
| | 0012H | DATA_0 | ⎭ |
| | 0011H | ID=2 | ⎫ |
| | 0010H | DATA_4 | ⎪ |
| | 000FH | DATA_3 | ⎬ DATA GROUP 2 |
| | 000EH | DATA_2 | ⎪ |
| | 000DH | DATA_1 | ⎪ |
| | 000CH | DATA_0 | ⎭ |
| | 000BH | ID=1 | ⎫ |
| | 000AH | DATA_4 | ⎪ |
| | 0009H | DATA_3 | ⎬ DATA GROUP 1 (INVALID DATA GROUP 1) |
| | 0008H | DATA_2 | ⎪ |
| | 0007H | DATA_1 | ⎪ |
| | 0006H | DATA_0 | ⎭ |
| | 0005H | ID=0 | ⎫ |
| | 0004H | DATA_4 | ⎪ |
| | 0003H | DATA_3 | ⎬ DATA GROUP 0 |
| | 0002H | DATA_2 | ⎪ |
| | 0001H | DATA_1 | ⎪ |
| | 0000H | DATA_0 | ⎭ |

Fig. 12

| ADDRESS | | | |
|---|---|---|---|
| FFFFH | 1 | FFH | |
| FFFEH | 1 | FFH | |
| FFFDH | 1 | FFH | |
| FFFCH | 1 | FFH | |
| ⋮ | | ⋮ | |
| 001BH | 1 | FFH | |
| 001AH | 1 | FFH | |
| 0019H | 1 | FFH | |
| 0018H | 1 | FFH | |
| 0017H | 1 | FFH | |
| 0016H | 1 | FFH | |
| 0015H | 1 | FFH | |
| 0014H | 1 | FFH | |
| 0013H | 1 | FFH | |
| 0012H | 1 | FFH | |
| 0011H | 1 | FFH | ⎫ |
| 0010H | 1 | DATA_1 | ⎬ ON WRITE OF DATA GROUP 1 |
| 000FH | 1 | DATA_0 | ⎭ |
| 000EH | 0 | ID=2 | ⎫ |
| 000DH | 1 | DATA_5 | |
| 000CH | 1 | DATA_4 | |
| 000BH | 1 | DATA_3 | ⎬ DATA GROUP 2 |
| 000AH | 1 | DATA_2 | |
| 0009H | 1 | DATA_1 | |
| 0008H | 1 | DATA_0 | ⎭ |
| 0007H | 0 | ID=1 | ⎫ |
| 0006H | 1 | DATA_1 | ⎬ DATA GROUP 1 |
| 0005H | 1 | DATA_0 | ⎭ |
| 0004H | 0 | ID=0 | ⎫ |
| 0003H | 1 | DATA_3 | |
| 0002H | 1 | DATA_2 | ⎬ DATA GROUP 0 |
| 0001H | 1 | DATA_1 | |
| 0000H | 1 | DATA_0 | ⎭ |

SEARCH DIRECTION ↓

Fig. 13

| SEARCH DIRECTION | ADDRESS | | | |
|---|---|---|---|---|
| ↓ | FFFFH | 1 | FFH | |
| | FFFEH | 1 | FFH | |
| | FFFDH | 1 | FFH | |
| | FFFCH | 1 | FFH | |
| | ⋮ | | ⋮ | |
| | 001BH | 1 | FFH | |
| | 001AH | 1 | FFH | |
| | 0019H | 1 | FFH | |
| | 0018H | 1 | FFH | |
| | 0017H | 1 | FFH | |
| | 0016H | 1 | FFH | |
| | 0015H | 1 | FFH | |
| | 0014H | 1 | FFH | |
| | 0013H | 1 | FFH | |
| | 0012H | 1 | FFH | |
| | 0011H | 0 | ID=1 | ⎫ END OF WRITE OF |
| | 0010H | 1 | DATA_1 | ⎬ DATA GROUP 1 |
| | 000FH | 1 | DATA_0 | ⎭ (VALID DATA GROUP 1) |
| | 000EH | 0 | ID=2 | ⎫ |
| | 000DH | 1 | DATA_5 | ⎪ |
| | 000CH | 1 | DATA_4 | ⎪ |
| | 000BH | 1 | DATA_3 | ⎬ DATA GROUP 2 |
| | 000AH | 1 | DATA_2 | ⎪ |
| | 0009H | 1 | DATA_1 | ⎪ |
| | 0008H | 1 | DATA_0 | ⎭ |
| | 0007H | 0 | ID=1 | ⎫ DATA GROUP 1 |
| | 0006H | 1 | DATA_1 | ⎬ (INVALID DATA GROUP 1) |
| | 0005H | 1 | DATA_0 | ⎭ |
| | 0004H | 0 | ID=0 | ⎫ |
| | 0003H | 1 | DATA_3 | ⎪ |
| | 0002H | 1 | DATA_2 | ⎬ DATA GROUP 0 |
| | 0001H | 1 | DATA_1 | ⎪ |
| | 0000H | 1 | DATA_0 | ⎭ |

Fig. 14

| ADDRESS OF ADDITIONAL BIT | 4 | MINIMUM WRITE AREA | ADDRESS OF DATA AREA |
|---|---|---|---|
| FFFFFFFEH | 1 | FFH | FFFFFFFFH |
| FFFFFFFCH | 1 | FFH | FFFFFFFDH |
| ... | | ... | ... |
| 00000020H | 1 | FFH | 00000021H |
| 0000001EH | 1 | FFH | 0000001FH |
| 0000001CH | 0 | ID=2 | 0000001DH |
| 0000001AH | 1 | DATA_5 | 0000001BH |
| 00000018H | 1 | DATA_4 | 00000019H |
| 00000016H | 1 | DATA_3 | 00000017H |
| 00000014H | 1 | DATA_2 | 00000015H |
| 00000012H | 1 | DATA_1 | 00000013H |
| 00000010H | 1 | DATA_0 | 00000011H |
| 0000000EH | 0 | ID=1 | 0000000FH |
| 0000000CH | 1 | DATA_1 | 0000000DH |
| 0000000AH | 1 | DATA_0 | 0000000BH |
| 00000008H | 0 | ID=0 | 00000009H |
| 00000006H | 1 | DATA_3 | 00000007H |
| 00000004H | 1 | DATA_2 | 00000005H |
| 00000002H | 1 | DATA_1 | 00000003H |
| 00000000H | 1 | DATA_0 | 00000001H |

ID,
FLASH MEMORY, MEMORY CONTROL CIRCUIT, MICROCOMPUTER AND MEMORY CONTROL METHOD

BACKGROUND OF THE INVENTION

1. Field of the Invention

The present invention relates to a flash memory, a memory control circuit, a microcomputer and a memory control method, and particularly, to a flash memory, a memory control circuit, a microcomputer and a memory control method, in which a writing operation and a reading operation of data is carried out by using an additional bit.

2. Description of the Related Art

In recent years, a semiconductor device having nonvolatile memories of a flash memory and an EEPROM (Electrically Erasable Programmable only Memory) has been used. Although being the nonvolatile memories, the flash memory and the EEPROM are different from each other in characteristics such as a data erasure unit, a number of times of rewrite times and circuit area.

To write data in the flash memory or the EEPROM, new data cannot be written unless data stored in a memory cell in the flash memory or the EEPROM is first erased. The flash memory and the EEPROM are different in an erasure unit. In the flash memory, data stored therein is erased in units of blocks, while in the EEPROM the data stored therein is erased in units of memory cells which can be selected by a word line and a bit line (hereinafter, the unit is referred to as a minimum write unit). For this reason, the flash memory which can erase data therein only in units of blocks has a limited usage in comparison with the EEPROM.

The flash memory and the EEPROM also have different number of times of the rewrite or erasure. For example, in case of a microcomputer, the flash memory guarantees the number of times of rewrite of about 100 to 1000, while the EEPROM guarantees the number of times of rewrite of about 10,000 to 100,000. In terms of the erasure unit and the number of times of rewrite or erasure, it is considered that the EEPROM is technically superior to the flash memory. However, to guarantee a circuit configuration for enabling erasure in the minimum write unit and the number of times of rewrite of 10 to 1,000 times as many as that of the flash memory, the EEPROM requires a device configuration capable of resisting influence of high electric field applied at the time of erasure, resulting in increases in size of the circuit. Since the increase in size of the circuit leads to increase in manufacturing cost, it is deemed that the flash memory is superior to the EEPROM from this point of view.

Therefore, the nonvolatile memories of the flash memory and the EEPROM are provided in the semiconductor device. While, a large amount of data with low frequency of rewrite is stored in the flash memory, a small amount of data with high frequency of rewrite is stored in the EEPROM. By using the flash memory and the EEPROM for different purposes in this manner, advantages of both of the flash memory and the EEPROM are effectively utilized.

However, a manufacturing process of the semiconductor device in which the multiple types of memories having different structures are mounted is complicated. In comparison with a manufacturing process of the semiconductor device in which only the one of the memories is mounted, the former manufacturing process requires addition of a lot of steps, thereby increasing the manufacturing cost. Therefore, a method has been devised of avoiding the complicated process while using only the flash memory as the nonvolatile memory and handling a part of the flash memory as the EEPROM. The method of using the flash memory like the EEPROM is generally called as an EEPROM emulation.

According to the EEPROM emulation, by utilizing an unused area of a storage area in the flash memory, that is, a free (blank) area where no data is written to a maximum extent and erasing data in units of blocks after use of all areas, the number of times of erasure accompanying data update is reduced, thereby increasing the virtual number of times of rewrite as in the EEPROM.

FIG. 1A shows a case where data A stored in the EEPROM is rewritten (updated) to data A' and FIG. 1B shows a case where the data A stored in the flash memory is rewritten (updated) to data A'. When the data A is rewritten to the data A', the data A' should be generally overwritten over the data A. However, since a writing operation cannot be performed without erasing data in the flash memory and the EEPROM, specifically, electric charges are removed (erased) from floating gates of all memory cell which exist in units of blocks or the minimum write unit. Then, an electric charge is injected (written) to the floating gate of an arbitrary memory cell based on data to be written to carry out rewrite. Since the erasure unit of the EEPROM is the minimum write unit, as shown in FIG. 1A, by erasing the data A to be rewritten and writing the data A' at the same location, rewrite of the data A into the data A' in the EEPROM is completed.

On the other hand, when the data A, B and C have been written in one block as shown in FIG. 1B the data B and C are erased at the same time if the whole block is erased to overwrite the data A since the rewrite unit of the flash memory is the block unit. Thus, by temporarily saving the data B and C in another area and writing the data A', B and C after erasure in the block, the rewrite of the data A to the data A' in the flash memory is completed.

However, in the EEPROM emulation, when a free (blank) area in which the data A' can be written exists as shown in FIG. 1B), the data A' is written into the blank area. Since the data A and A' coexists, the data A is invalidated as an invalid data according to a predetermined method. In use of the EEPROM emulation, erasure in units of blocks becomes unnecessary as long as a blank area for writing new data. Furthermore, temporary saving and rewriting of the other data (corresponding to data B and C in FIG. 2) which accompanies the block erasure can be avoided. That is, the number of times of rewrite or erasure can be reduced, and the virtual number of times of rewrite can be increased as in the EEPROM. Moreover, data can be rewritten without considering protection of the other data as in the EEPROM.

Next, referring to FIGS. 2 to 7, the EEPROM emulation will be described in detail. FIG. 2 shows a data write unit in the conventional EEPROM emulation (hereinafter referred to as emulation write unit). Data contained in the emulation write unit is composed of n+1 data of DATA_0 to DATA_n and a data number (ID) as a name of a group of n+1 DATA (that is, the ID is data associated with a plurality of data). A value of the ID must be a value other than a value in the erased state, that is, a value read from the free area. The number of data (n) in each data group must be common for each ID and must not have different values. For example, when the number of data contained in a data group O to which the identification number ID=0 is assigned is 5, the number of data contained in a data group 1 to which the identification number ID=1 must be 5. A plurality of data forming the emulation write unit are collectively referred to as a data group.

FIG. 3 is a flow chart showing a writing process in the conventional EEPROM emulation. FIGS. 4, 5 and 6 each show a flash memory that stores the data group 0 to the data group 2 therein. The flash memory in FIGS. 4, 5 and 6 is formed of one block (that is, the erasure unit is a whole flash memory) and has minimum write unit areas (addresses) of 0000H address to FFFFH address. The size of the data that can be stored in each address is 8 bits (00H to FFH). The data groups 0 to 2 are written in addresses 0000H to address 00011H. The data group 0 to the data group 2 are each formed of the DATA_0 to DATA_4 and the ID (ID=0 to 2). If the erased state of the flash memory is represented as FFH, as described above, since the ID must be a value other than the value read out from the data area in the erased state, the possible values of the ID are 00H to FEH. As shown in FIG. 2, an area where the DATA and ID are stored is defined as a data area.

Referring to FIGS. 3, 4, 5 and 6, a writing process in the EEPROM emulation and an example of a process of writing the data group 1 will be described. As shown in FIG. 3, the writing process is carried out in two stages of a blank search for identifying an area where new data is written (S13-1 to S13-4) and of sequentially writing DATA_0 to ID in the identified blank area (S13-1 to S13-6).

At a step S13-1, starting from an address FFFFH as a last address in the flash memory, data is read in the search direction of the address FFFFH→address FFFEH→address FFFDH→ . . . →address 0001H→address 0000H. That is, the data is read out from the side of the blank area in the flash memory in FIG. 2.

At a step S13-2, it is determined whether or not the read value is a value other than FFH (FFH is a value representing the erased state (unused free state)). When the value other than FFH is read, the process proceeds to a step S13-4. On the other hand, when FFH is read, the process proceeds to the step S13-3.

At the step S13-3, the read address is decremented by +1 (since the search direction is from the last address toward a start address, the read address is incremented by −1). The same shall apply hereinafter, and the reading operation is performed again. In FIG. 4, since the area of the address FFFFH to an address 0012H is an unused (blank) area, the process at the steps S13-2 and S13-3 is repeated up to the address 0012H.

At a step S13-4, when a value other than FFH is read at step S13-2, an address read immediately before the address at which the value other than FFH is read is identified as a head address of the blank area (write start address) when data other than FFH is read, a boundary between the used area and the unused (blank) area can be identified. Thus, the address where FFH is finally read can be determined as the head address of the blank area.

In FIG. 4, since the ID=2 (value other than FFH) is read at an address 00011H, the address 00011H is determined as the last address (boundary address) between the used area, and the address 0012H is determined as the address read immediately before the last address is determined as the head address of the blank area. As described above, the possible values of the ID are 00H to FEH. If the value of the ID is FFH, it cannot be distinguished from the blank area. Thus, FFH must not be used as the value of the ID.

At a step S13-5, the data (DATA_0 to DATA_n) are written. The writing operation is performed in the order of DATA_0→DATA_1→ . . . →DATA_n. In FIG. 5, The DATA_0 to DATA_4 in the data group 0 are written.

At a step S13-6, the ID is written. The ID is written at the end of an emulation write unit. Thus, when the ID is written, a series of writing processes of the data groups having a plurality of data is completed.

In FIG. 6, the writing process of the ID=1 in the data group 0 is completed and the writing process of the data group 1 composed of the DATA_0 to DATA_4 and the ID=1 is completed. The writing process in the conventional EEPROM emulation is performed in this way. Then, when new data group is written, an additional writing process is performed by using the same steps. In FIG. 6, the new data group is written at an address 0018H. Also, in FIG. 4, although the written data groups 0 to 2 exist, the writing operation is performed from an address 0000H when no data group has been written. Furthermore, when blank searching reveals that the blank area is lack for writing all data contained in the data group, an erasing operation becomes necessary, and the erasing operation needs to be performed while protecting necessary data, as described above.

Next, a reading operation in the conventional EEPROM emulation will be described. FIG. 7 is a flow chart showing a conventional reading process. As shown in FIG. 7, the reading process is performed in two stages of an ID search process (steps S17-1 to S17-6) for identifying the data group to be read by searching the ID associated with a plurality of data contained in the data group, and a read process (S17-7) of the identified data group from the flash memory. As a specific example, the reading process of the data groups 0 and 1 from the flash memory shown in FIG. 6 will be described. However, since the second writing process of the data group 1 (data update) is performed in the flash memory shown in FIG. 6, the data group 1 (address 0012H to address 0017H) written last time is a valid data group and the data group 1 (address 0006H to address 0008H) written previously is dealt as an invalid data group.

At a step S17-1, starting from an address FFFFH as a last address in the flash memory, data is read in the search direction of the address FFFFH→address FFFEH→address FFFDH→ . . . →address 0001H→address 0000H. That is, the data is read out from the side of the blank area in the flash memory in FIG. 6. This process is the same as the step S13-1 in the above-described writing process.

At a step S17-2, it is determined whether or not the read value is a value other than FFH (FFH is a value representing the erased state). When the value other than FFH is read, the process proceeds to a step S17-4. On the other hand, when FFH is read, the process proceeds to a step S17-3.

At a step S17-3, the read address is decremented by 1 and the reading operation is performed again. In FIG. 6, since the area of the address FFFFH to the address 0018H is an unused (blank) area, the process at the steps S17-2 and S17-3 is repeated up to the address 0018H.

At a step S17-4, when a value other than FFH is read, it is determined whether or not the read value is the ID associated with the DATA in the data group to be read (target ID). In FIG. 6, if the data group to be read is the data group 0, the ID can be determined as the target ID when the read value is the ID=0. At the step S17-2, a value other than FFH is detected at an address 0017H and the value stored at the address 0017H is the ID=1. Thus, since the data group to be read is the data group 0, determination is made that the read value is not the target ID. On the other hand, if the data group to be read is the data group 1, the read value can be determined as the target ID since the data stored at the address 0017H is the ID=1.

At a step S17-5, when the read value is not the target ID, a reading process is performed at the address decremented from the read address by +6 again. Then, it is determined whether or not the read value is the target ID at the step S17-4. In FIG. 6, when the data group to be read is the data group 0, the address decremented from the address 0017H by +6 is an address 00011H. Since the value read at the address 00011H is the ID=2, the read value is not the target ID (ID=0). Accordingly, the read address is decremented by +6 again.

At a step S17-6, when the read value is the target ID at the step S17-4, the address decremented from the address where the target ID is read by +5 is identified as the head address of the data group to be read. In FIG. 6, when the data group 0 is read, an address 0000H decremented from the address 0005H by +5 is identified as the head address of the data group to be read since determination is made that the target ID is stored at an address 0005H at S17-4. When the data group 1 is read, an address 0012H decremented from the address 0017H by +5 is identified as the head address of the data group to be read since determination is made that the target ID is stored at the address 0017H at S17-4.

At a step S17-7, the DATA_0 is read from the head address of the data group that is identified at the step S17-6 and the DATA_1 to DATA_n are read sequentially while incrementing the address by +1. In FIG. 6, by reading the DATA_0 to DATA_4 from the address 0000H to address 0004H, the reading process of the data group 0 is completed. By further reading the DATA_0 to DATA_4 from the address 0012H to address 0016H, the reading process of the data group 1 is completed.

The data group 1 is updated in the flash memory shown in FIG. 6. Data of the data group 1 are stored at two locations and the valid data group is the data group written at later time, that is, closer to the blank area side. According to the method described at the steps S17-1 to S17-6, the ID is searched from the blank area side, and when the read value becomes equal to the target ID, search of the data group to be read is finished. Thus, even when a plurality of data groups having the same ID are stored in the flash memory, the newest data group, that is, the valid data group can be read.

Also, in an example of a reading process by using the data group 1 as the data group to be read in FIG. 6, the valid data group 1 (the address 0012H to address 0017H) is selected without selecting the invalid data group 1 (the address 0006H to address 0008H).

In the writing process flow in FIG. 3 and the reading process flow in FIG. 7, the blank search and the ID search are performed from the address FFFFH (last address). On the contrary, the search may be performed from the address 0000H (start address). However, in this case, in the writing process flow, the address obtained by incrementing the address where the value other than FFH is finally read by +1 is defined as the head address of the unused (blank) area. In the reading process, only ID is read by incrementing the read address by +6, and it is determined whether or not the read value is the target ID in the reverse direction from the ID read immediately before at the time when the read value is FFH. In this manner, the target ID can be identified.

A technique concerning such EEPROM emulation is disclosed in "Application Note U17057JJ3VOAN00" (the third edition, NEC Electronics Corporation, November, 2004, pp. 25-27). In this application note, the emulation write unit is formed of a data number, a data 1, a delimiter, and a data 2, and FFH (erased state) must not be used as the data number. The data number is stored in the flash memory every four bytes. By reading the data number while incrementing from the head of a block for every four bytes, the newest data is searched. When a plurality of data numbers having the same number are found, data closest to an end of data is dealt as a newest data.

As described above, in the reading process of the data group written by using the EEPROM emulation, the data number (ID) associated with each emulation write unit (the data group) is searched, and it is determined whether or not the searched ID is the ID of data to be read. At this time, when the storage location of the ID in the data written in the flash memory cannot be found, the ID cannot be searched. For this reason, conventionally, by making the number of data contained in the emulation write unit (the data group) same, the ID is regularly stored at each address in the flash memory, thereby allowing ID search. In FIG. 5, in the data group 0 to the data group 2, the emulation write unit (the data group) is composed of 6 data of the ID and the DATA_0 to DATA_4, and the ID is regularly arranged and written in the flash memory every six addresses.

However, it is a limit in product design in the viewpoint from a user and is a substantial disadvantage that the number of data of the emulation write unit must be common (a fixed value) in all emulation write units (the data groups). If the value used as the ID is prohibited from being used as values of the DATA_0 to DATA_n, the ID can be searched even when the number of data in the emulation write unit (the data group) is not common (a fixed value) in all emulation write units (the data groups). However, this limits the values of the DATA_0 to DATA_n used by the user, which is unpractical.

SUMMARY OF THE INVENTION

In an aspect of the present invention, a flash memory includes a data area in which first and second k-bit data (k is a natural number) are stored; and an additional data area in which a first additional m-bit data (m is a natural number) and a second additional m-bit data used to respectively identify the first and second data are stored. The first additional data and the second additional data have different values.

Here, the flash memory may further include a terminal used to input the first and second data; and a terminal used to input the first and second additional data.

Also, the first and second additional data may be stored in same addresses as the first and second data respectively corresponding to the first and second additional data.

Also, when a first value indicates an erased state of the flash memory, the first additional data may be the first value.

Also, the m may be one.

Also, the second data may be a data related with the first data.

In another aspect of the present invention, a memory control circuit accesses a flash memory in units of sets of a first data and a second data. The memory control circuit writes a first additional data to identify the first data when the first data is written in the flash memory, and writes a second additional data to identify the second data when the second data is written in the flash memory, and the first additional data is different from the second additional data.

Here, the memory control circuit may carry out a reading process of the second data based on the second additional data.

Also, the first and second additional data may be stored in same addresses as the first and second data, respectively.

Also, when a first value indicates an erased state of the flash memory, the first additional data may be the first value.

In still another aspect of the present invention, a microcomputer includes a flash memory; a central processing unit (CPU); and a memory control circuit configured to access the flash memory in units of sets of a first data and a second data based on an instruction from the CPU. The memory control circuit writes a first additional data to identify the first data when the first data is written in the flash memory, and writes a second additional data to identify the second data when the second data is written in the flash memory, and the first additional data is different from the second additional data.

Here, the CPU may output the first data and the first additional data as a write data when instructing the memory control circuit to write the first data, and output the second data and the second additional data as the writing data when instructing the memory control circuit to write the second data.

Also, the CPU may output a read instruction of the second data to the memory control circuit based on the second additional data.

Also, the first and second additional data may be stored in same addresses as the first and second data, respectively.

Also, when a first value indicates an erased state of the flash memory, the first additional data may be the first value.

Also, a bit length of each of the first and second additional data may be one bit.

Also, the second data may be a data related with the first data.

In still another aspect of the present invention, a memory control method in accessing a flash memory in units sets of a first data and a second data, is achieved by writing the first data and a first additional data to identify the first data in the flash memory; and by writing the second data and a second additional data to identify the second data in the flash memory, the second additional data being different from the first additional data.

Here, the memory control method may be achieved by further carrying out a first reading process to an additional data area of the flash memory in which the first and second additional data are stored; carrying out a first determination of whether a data read out in the first reading process is the second additional data; and specifying a write address of the flash memory based on a result of the first determination.

Also, the memory control method may be achieved by further carrying out a second reading process to an additional data area of the flash memory in which the first and second additional data are stored; carrying out a second determination of whether a data read out in the second reading process is the second additional data; when the read out data in the second reading process is the second additional data, reading out the second data corresponding to the read out second additional data; carrying out a third determination of whether the read out second data is a target data; specifying a read address of the flash memory based on a result of the third determination; and reading out the first data from the specified read address of the flash memory.

Also, a read access direction may be opposite to a write access direction in the flash memory.

Also, the first and second additional data may be stored in same addresses as the first and second data, respectively.

Also, when a first value indicates an erased state of the flash memory, the first additional data may be the first value.

Also, the second data may be a data related with the first data.

Also, the writing a second data and a second additional data may be achieved by writing the second data in the flash memory; and by writing the second additional data in the flash memory. The write of the second additional data may be executed after the write of the second data.

According to the present invention, the number of data in the emulation write unit, that is, the value of n of the DATA_0 to DATA_n need not be common in all data groups and can be freely set for each data group, resulting in improvement in flexibility of design by the user.

BRIEF DESCRIPTION OF THE DRAWINGS

FIG. 5 is a diagram showing the conventional writing process (flash memory);

FIG. 6 is a diagram showing the conventional writing process (flash memory);

FIG. 12 is a diagram showing a writing process according to the first embodiment of the present invention (flash memory);

FIG. 13 is a diagram showing the writing process according to the first embodiment of the present invention (flash memory);

FIG. 14 is a diagram showing a modification example of assignment of addresses in the flash memory according to the first embodiment of the present invention;

DESCRIPTION OF THE PREFERRED EMBODIMENTS

Hereinafter, a microcomputer having a flash memory and a memory control circuit according to the present invention will be described in detail with reference to the attached drawings.

First Embodiment

Figure 8:
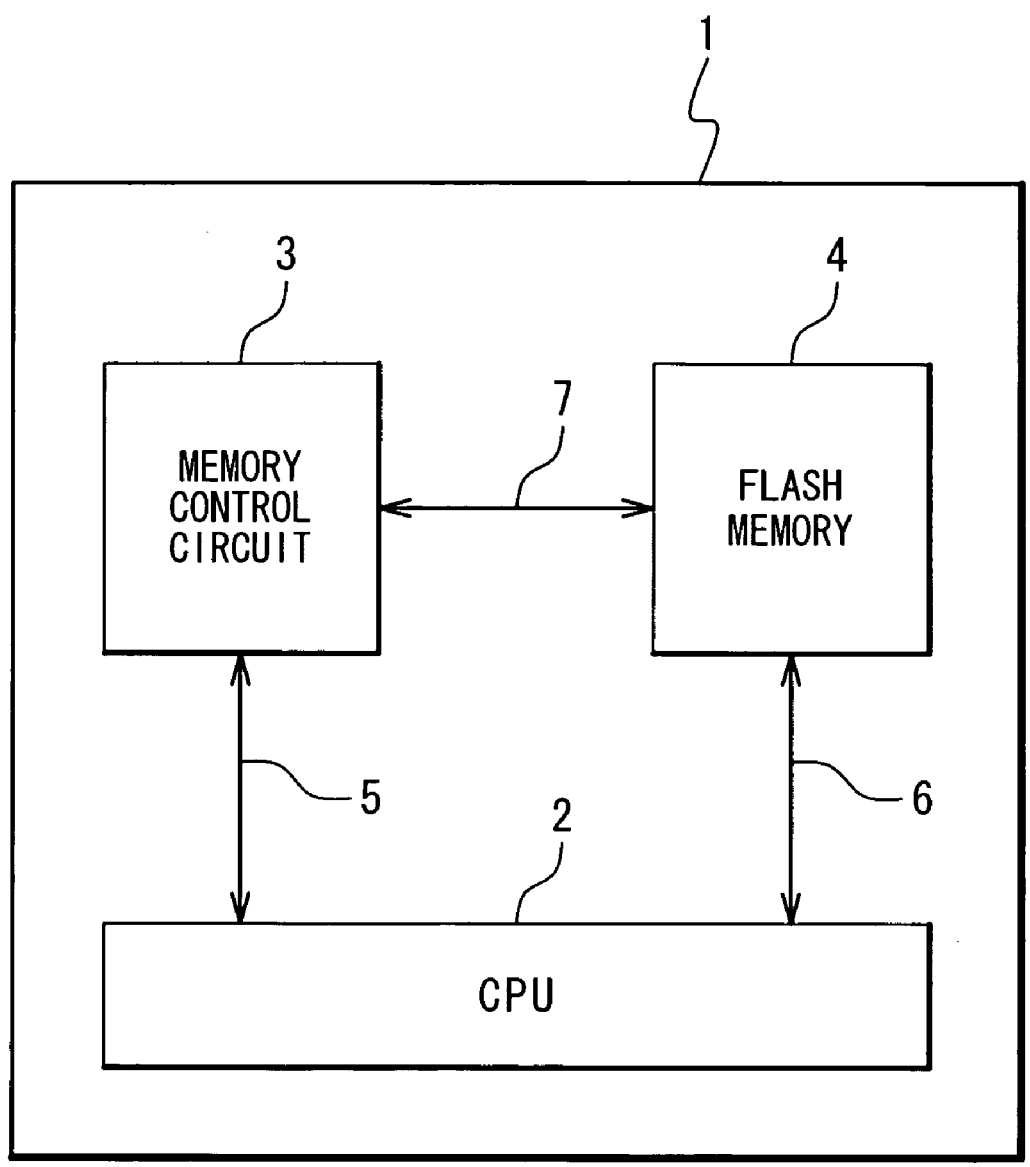
FIG. 8 is a block diagram showing configuration of a microcomputer according to a first embodiment of the present invention.

FIG. 8 is a block diagram showing a configuration of a microcomputer according to the first embodiment of the present invention. A microcomputer 1 has a central processing unit (CPU) 2, a memory control circuit 3 and a flash memory 4. The CPU 2 is connected to the memory control circuit 3 and the flash memory 4 via buses 5 and 6, respectively. The CPU 2 outputs read/write commands, read/write addresses and write data to the memory control circuit 3. The CPU 2 acquires data read out from the flash memory 4. The memory control circuit 3 is connected to the flash memory 4 via a wire 7 and outputs a read/write control signal (control signal of a read/write mode), the read/write addresses and write data to the flash memory 4. The flash memory 4 performs a reading/writing operation on the basis of the control signal from the memory control circuit 3 and in the reading operation, the read data is outputted to the CPU.

Figure 1A:
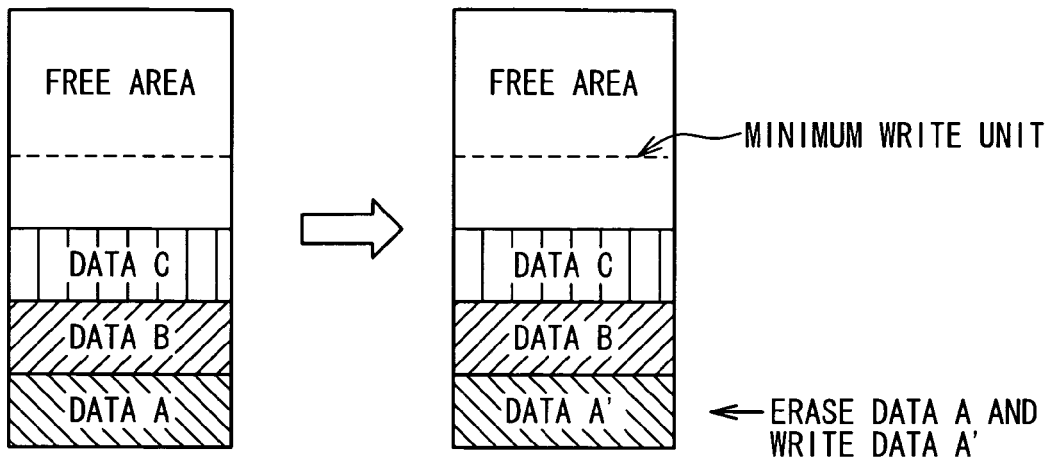
FIGS. 1A and 1B are diagrams showing rewriting (update) of data into a conventional EEPROM and flash memory (EEPROM emulation)
Figure 1B:
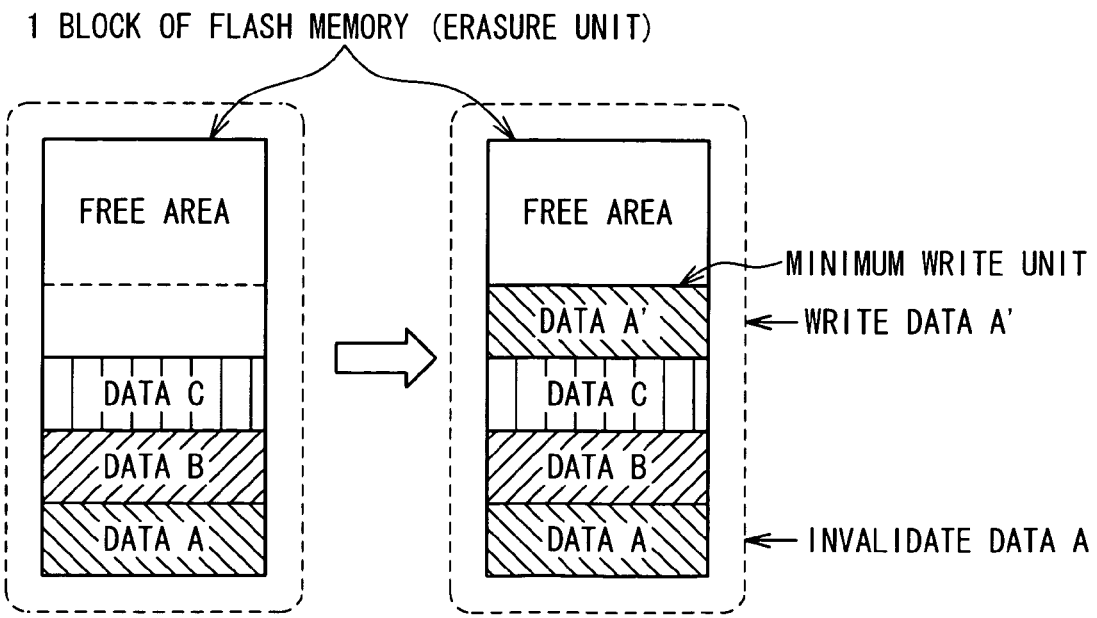
Figure 2:
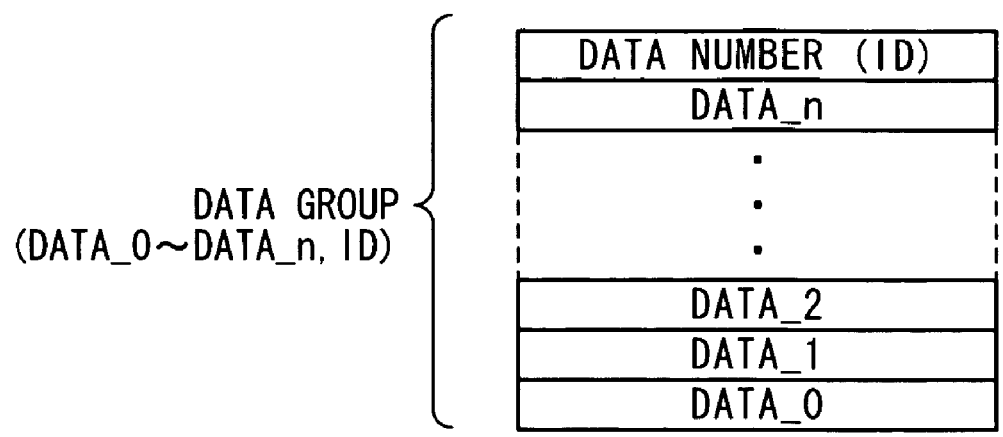
FIG. 2 is a diagram showing a data write unit in the conventional EEPROM emulation.
Figure 3:
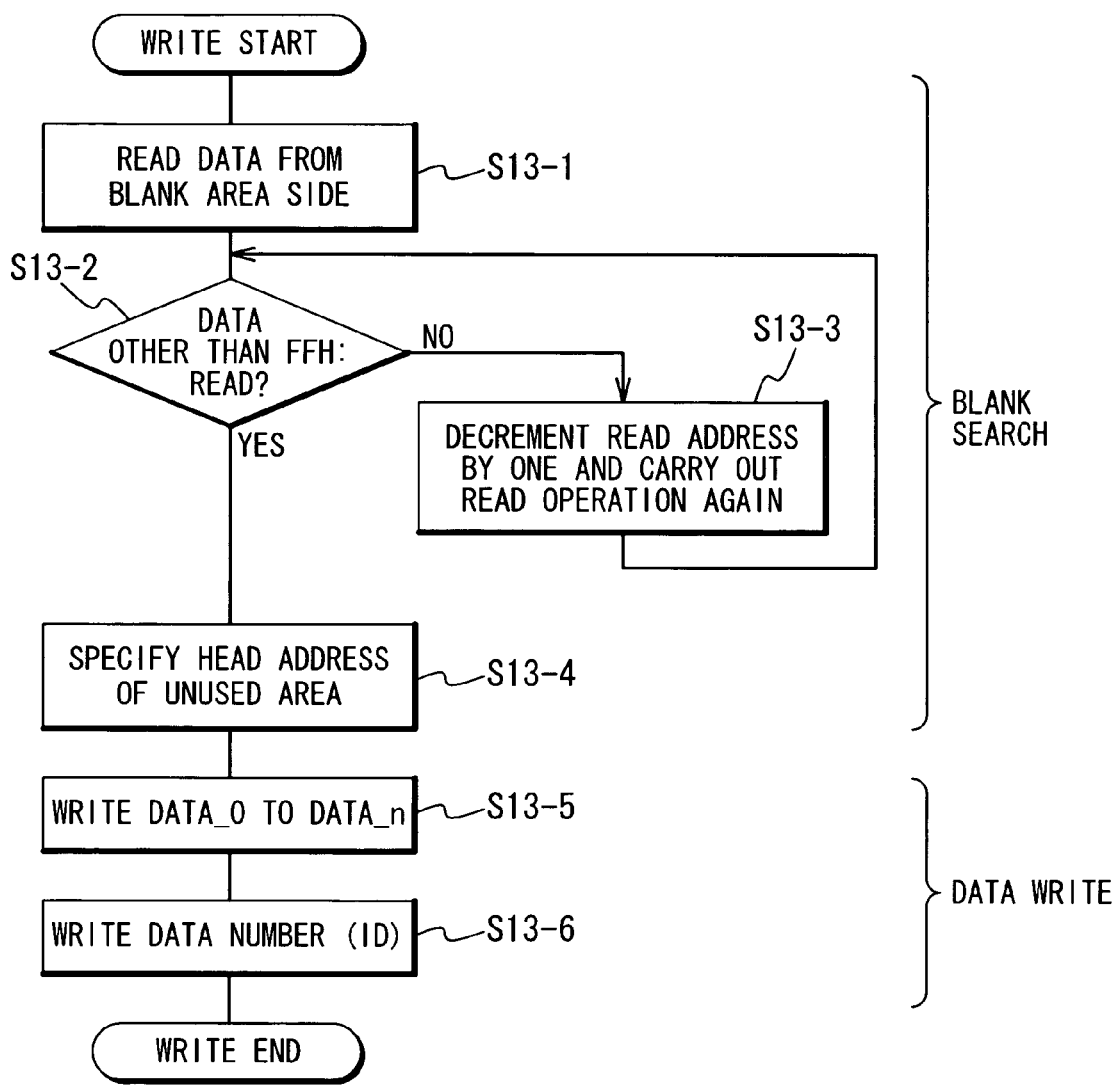
FIG. 3 is a flow chart showing a conventional writing process flow.
Figure 4:
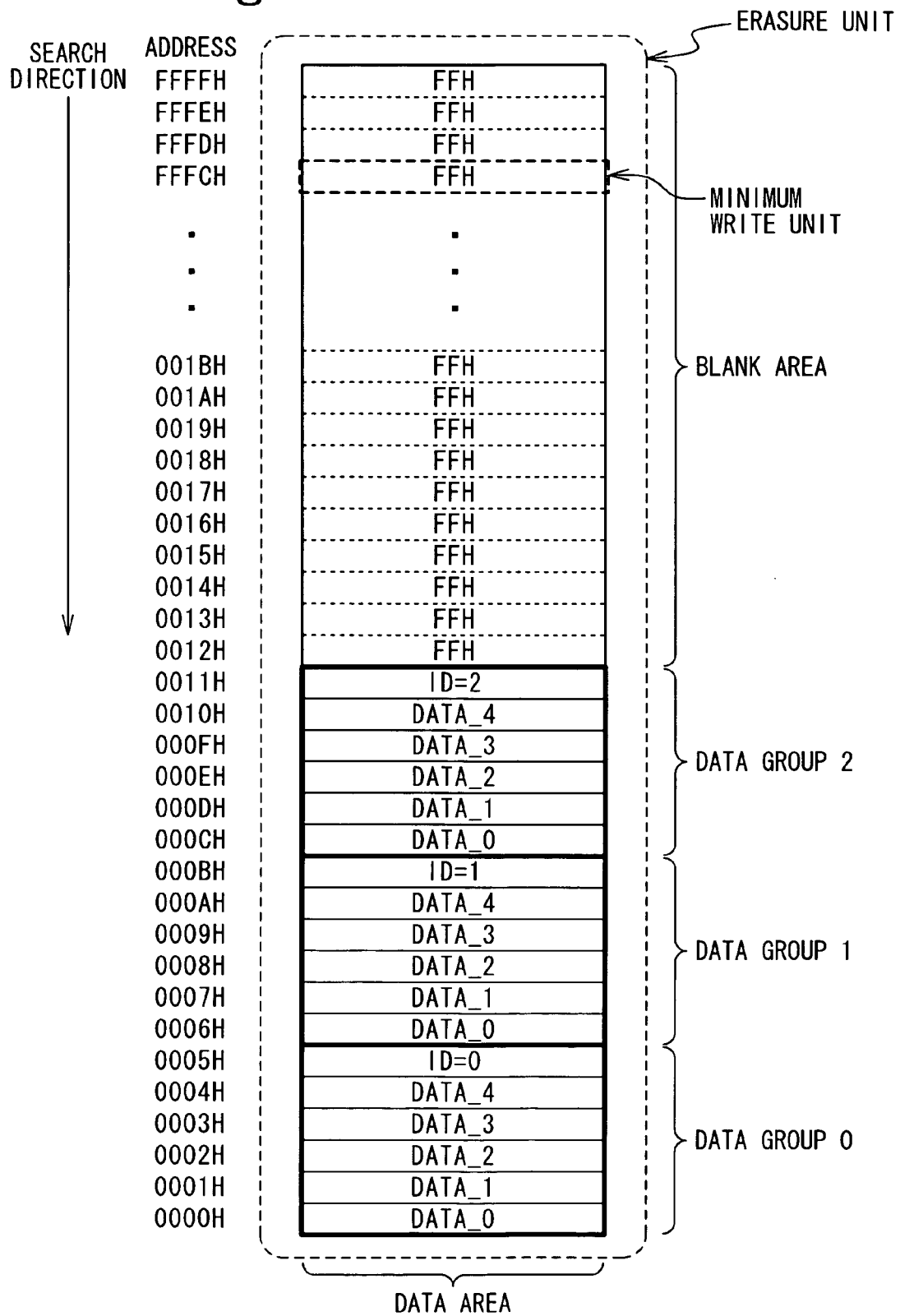
FIG. 4 is a diagram showing conventional writing process (flash memory)
Figure 7:
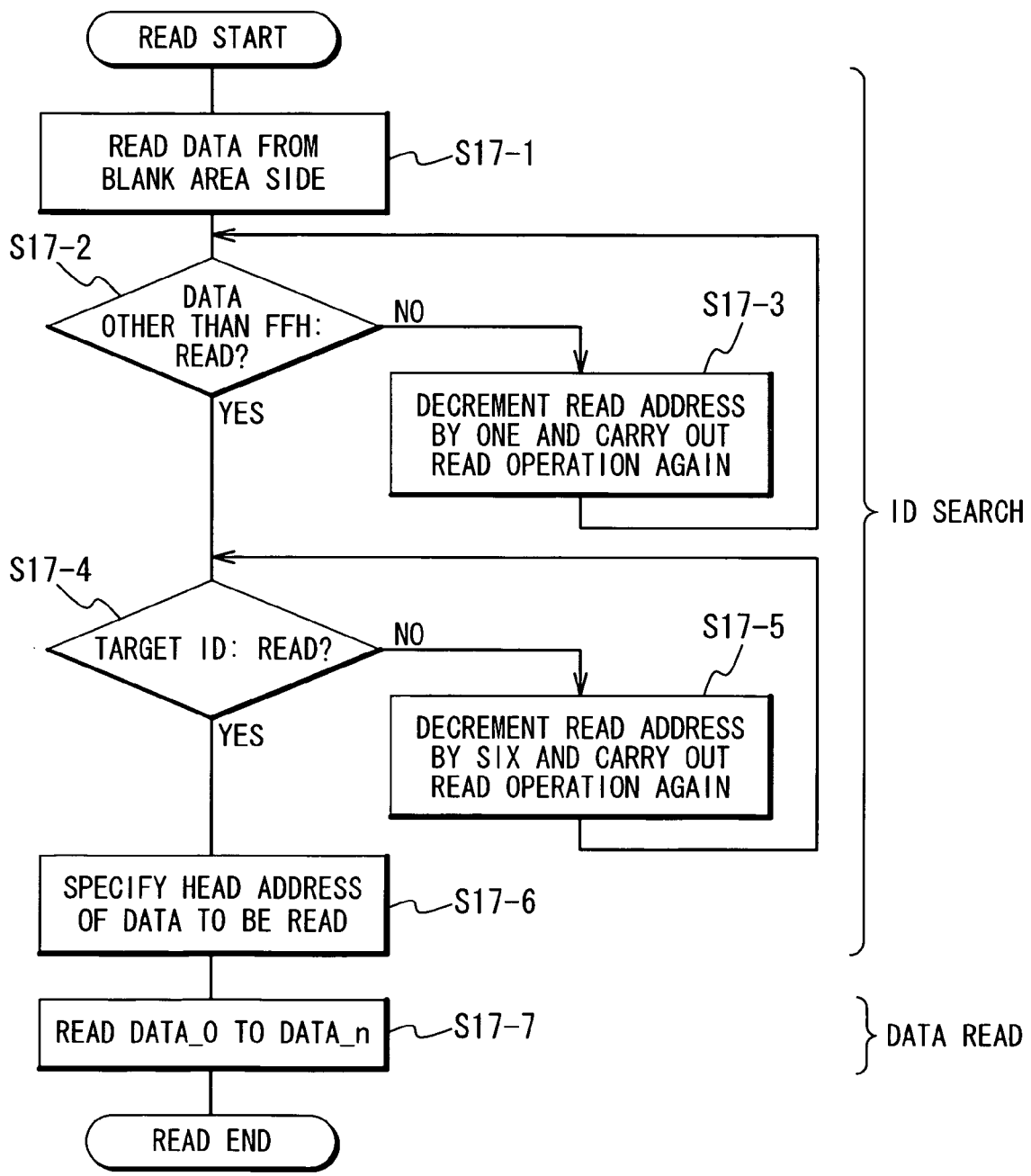
FIG. 7 is a flow chart showing a conventional reading process flow.
Figure 9:
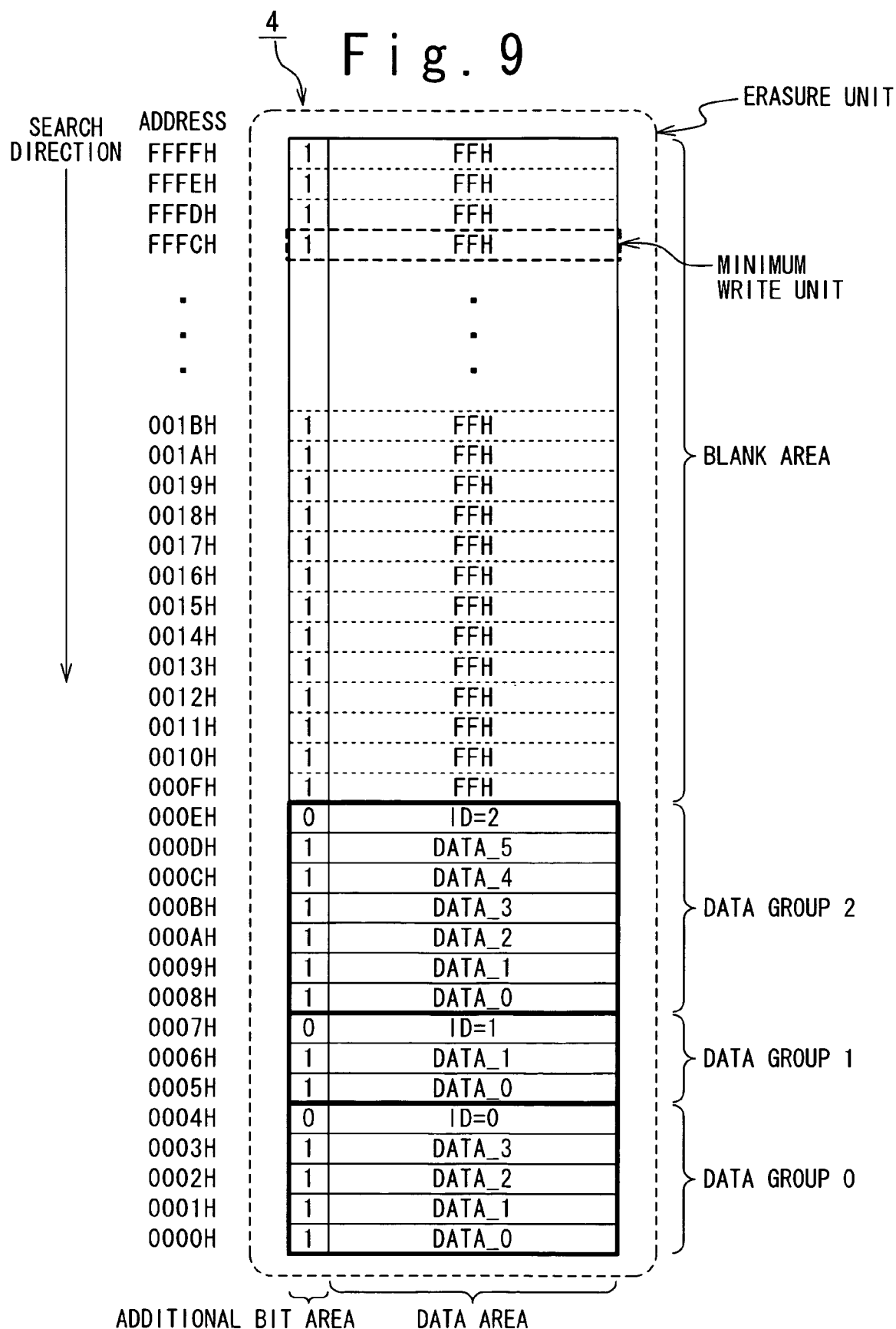
FIG. 9 is a diagram showing a configuration of a flash memory in the microcomputer according to the first embodiment of the present invention.

FIG. 9 is a diagram showing a configuration of the flash memory 4 mounted in the microcomputer 1 according to the first embodiment. The flash memory 4 shown in FIG. 9 is formed of one block (that is, an erasure unit is the whole flash memory 4), and has minimum write unit areas (addresses) from an address 0000H to an address FFFFH. The data that can be stored at each address is 9-bit data (000H to 1FFH). That is, the flash memory 4 in the first embodiment has the configuration in which one bit is added to each address of the memory cells of the conventional flash memory shown in FIG. 7.

Data of 9-bit length is formed by adding an additional data (described later) of 1-bit length to data of B-bit length that should be originally dealt. Although the data to be dealt is the data of 8-bit length in the following description, the data to be dealt is not limited to data of 8-bit length and may be data of at least 1 bit (1>0). Furthermore, the additional data is not limited to the data of 1-bit length and may be data of m-bit length (m>0). However, when the data of 1-bit length and the additional data of m-bit length are simultaneously written/read to/from the flash memory 4, the wire 7 needs to have at least l+m bit width and the flash memory 4 needs to have terminals for inputting a signal of l+m bit width. An area where the data of 8-bit length is stored is defined as a data area and an area where the additional bit is stored is defined as an additional bit area.

The data group 0 to the data group 2 have been already written from the address 0000H to address 000EH of the flash memory 4, and a read value in the unused area, that is, the read value in the erased state is set to 1FFH (the additional bit of 1H+data of FFH).

Figure 10:
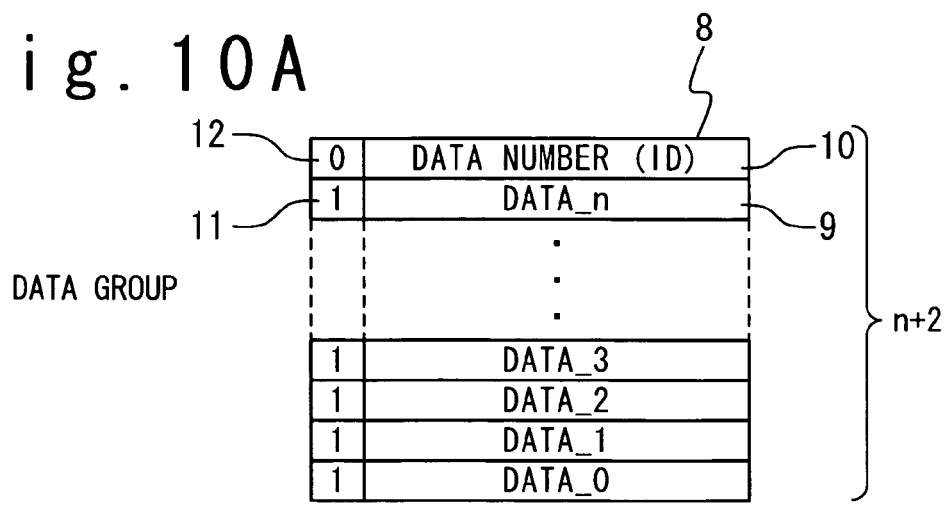
FIGS. 10A to 10D are diagrams showing data structures of an emulation write unit according to the first embodiment of the present invention.

FIGS. 10A to 10D show typical data structures of the emulation write unit (the data group) according to the first embodiment and the data group 0 to the data group 2 written into the flash memory 4 shown in FIG. 9. FIG. 10A shows a general data structure of the emulation write unit (the data group). Similar to the conventional example, the emulation write unit (the data group) 8 is formed of (n+1) data 9 from the DATA_0 to DATA_n and a data number (ID) 10 as a name Of a group of (n+1) data (that is, the ID is data associated with a plurality of data).

However, this structure is different from the conventional structure in two points. A first difference is in that data of 1-bit length to be referred to as an additional data is added to each of the plurality of data of the data group. As shown in FIG. 10A, the additional data 11 of 1H is added to each of the DATA_0 to DATA_n and the additional data 11 of 0H is added to the ID. These additional data are added to identify the DATA_0 to DATA_n and the ID.

A second difference is in that the value of n is not common to the data groups and can be freely set. FIGS. 10B to 10D show data structures of the data group 0 to the data group 2. The data group 0, the data group 1 and the data group 2 are formed of 5, 3 and 7 data, respectively. The value n may be 1, that is, the data group may be formed of the DATA_0 and the ID.

Figure 11:
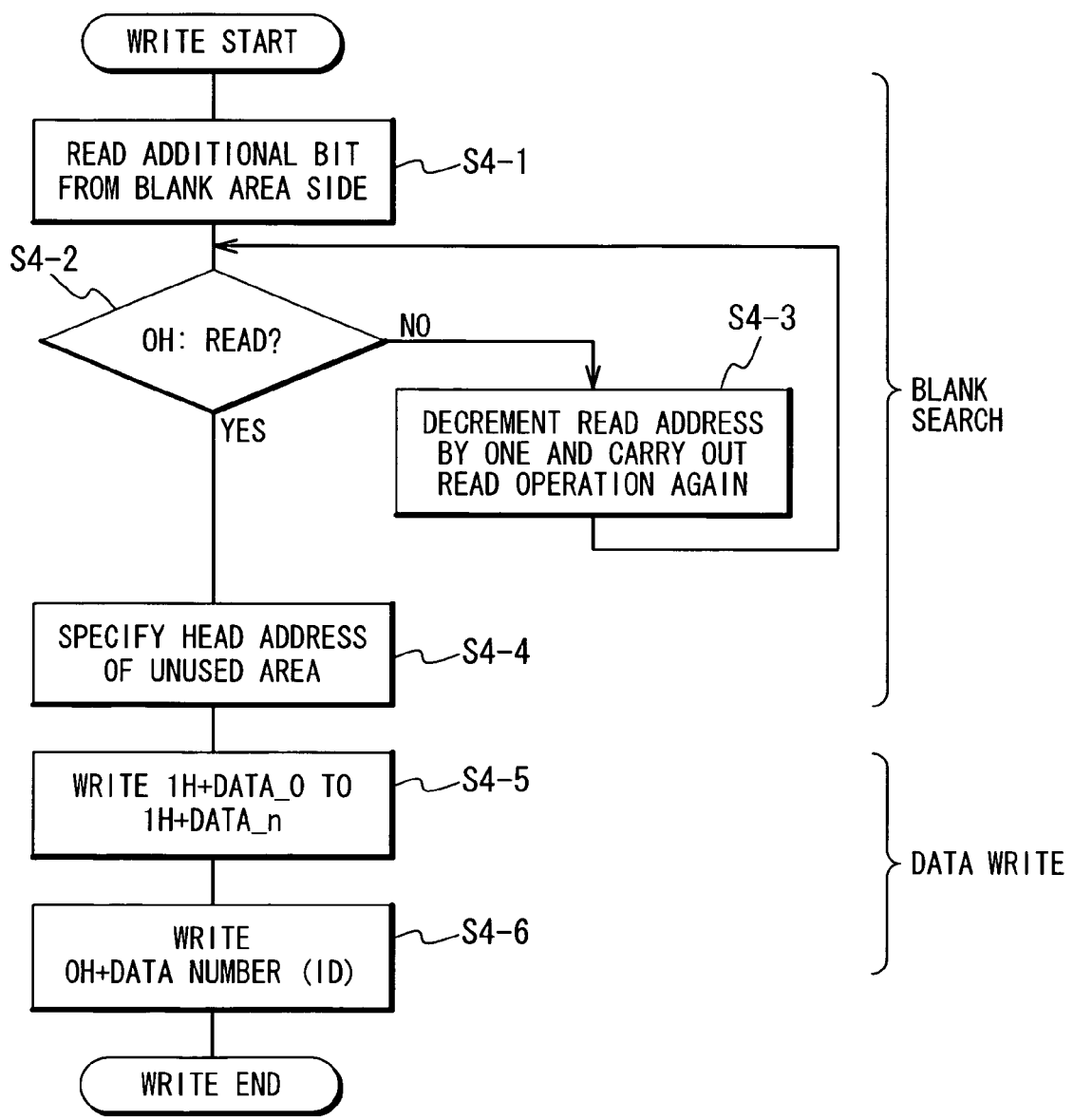
FIG. 11 is a flow chart showing a writing process according to the first embodiment of the present invention.

Next, the writing operation in the EEPROM emulation according to the first embodiment of the present invention will be described. FIG. 11 is an operational flow chart showing the writing process of the microcomputer according to the first embodiment.

Referring to FIGS. 8, 9 and 11, a process in which the microcomputer 1 shown in FIG. 8 writes the data group 1 (see FIG. 11B) in the unused (blank) area of the flash memory 4 shown in FIG. 9 will be described by using a specific example. As shown in FIG. 11, the writing process is performed in two stages of blank search (steps S4-1 to S4-4) for identifying addresses and a data write (steps S4-5 to S4-6) of sequentially writing 1H+DATA_0 to 1H+DATA_n, 0H+ID to the identified blank area.

At the step S4-1, starting from the address FFFFH as the last address of the flash memory 4, the CPU 2 reads the additional data in the search direction of address FFFFH→address FFFEH→address FFFDH→ . . . →address 0001H→address 0000H. Specifically, the CPU 2 outputs a read command and a read address (the first read address is the address FFFFH) to the memory control circuit 3. The memory control circuit 3 receives the read command from the CPU 2 and controls the reading operation of data of 9-bit length stored in the designated read address of the flash memory 4. The flash memory 4 outputs the read data of 9-bit length to the CPU 2. The CPU 2 determines and acquires the additional data among the data of 9-bit length read from the flash memory 4.

At the step S4-2, the CPU 2 determines whether or not the read additional data is 0H. When the additional data of 0H is read, the process proceeds to the step S4-4. On the other hand, when the additional data of 1H is read, the process proceeds to the step S4-3.

At the step S4-3, the CPU 2 decrements the read address by +1 (since the search direction is from the last address toward a start address, the read address is incremented by −1. The same shall apply hereinafter), and the reading operation of the additional data is performed again. In FIG. 9, since the area of the address FFFFH to the address 000FH are an unused (blank) area and the read value of the additional data area is 1H in the erased state, the process at the steps S4-2 and S4-3 is repeated up to the address 000FH.

At the step S4-4, when the additional data of 0H is read at the step S4-2, the CPU 2 identifies the address to which the reading process is performed immediately before the additional data of 0H is read as a head address (write start address) of the blank area. The fact that the additional data of 0H is read means that data is written from the address to the start address. Thus, the address can be determined as a boundary between the used area and the unused (blank) area. Accordingly, the address from which the additional data of 1H is finally read can be identified as the head address of the blank area. In FIG. 9, since the additional data of 0H is read from the address 000EH, the address 000EH is determined as the last address (boundary) of the used area. The address 000FH as the address to which the reading process is performed immediately before the address 000EH can be identified as the head address of the blank area, that is, the address to which the writing operation of new data starts to be performed.

At the step S4-5, the CPU 2 writes the data (DATA_0 to DATA_n) and the additional data (bit). Specifically, the CPU 2 designates the head address of the blank area identified at the step S4-4 as the write address and outputs the write data as the 1H+DATA_0 to the memory control circuit 3. The memory control circuit 3 controls the writing operation of the 1H+DATA_0 at the designated address in the flash memory 4. Subsequently, the CPU 2 increments the write address by +1, designates the address and outputs the write data as 1H+DATA_1 to the memory control circuit 3. The memory control circuit 3 controls the writing operation of 1H+DATA_1 at the designated address in the flash memory 4. Similarly, the writing process of the 1H+DATA_2 to 1H+DATA_n is performed to the flash memory 4. In the process of writing the data group 1 (formed of DATA_0, DATA_1, and ID) to the flash memory 4 in FIG. 9, the 1H+DATA_0 is written at the address 000FH and the 1H+DATA_11 is written at the address 00010H (FIG. 12).

At the step S4-6, the CPU 2 writes the additional data (0H) and the ID via the memory control circuit 3. Since the additional data added to the ID is 0H, the address to which the writing operation is finally performed at the step S4-5 is incremented by +1, designates the address and writes the 0H+ID at the address. Since the ID is written at the end of the emulation write unit, by completing the writing operation of the ID, a series of writing processes to the emulation write units is ended. In FIG. 13, the 0H+ID is written at the address 00011H. The writing process in the EEPROM emulation according to the first embodiment of the present invention is carried out through these steps. When new data group is written, the additional writing operation is carried out through the same steps. In FIG. 13, the writing process of the new data starts at the address 0012H.

When the additional data is read from the flash memory 4 at the step S4-1, the data of 8-bit length stored in the data area at the same address is read at the same time. However, only the additional data of 1 bit may be read. In this case, for example, as shown in FIG. 14, an address is assigned to each of the additional data area, in which the additional data are stored, and the data area in which the DATA and the ID are stored (thus, addresses assigned to the flash memory 4 are address 00000000H to address FFFFFFFFH and each address represents the minimum write unit) and the CPU 2 designates only the address assigned to the additional data area to the memory control circuit 3. Specifically, the read address at the step S4-1 becomes address FFFFFFFEH→address FFFFFFFCH→address FFFFFFFA→ . . . →address 00000001H→address 0000000H.

Figure 15:
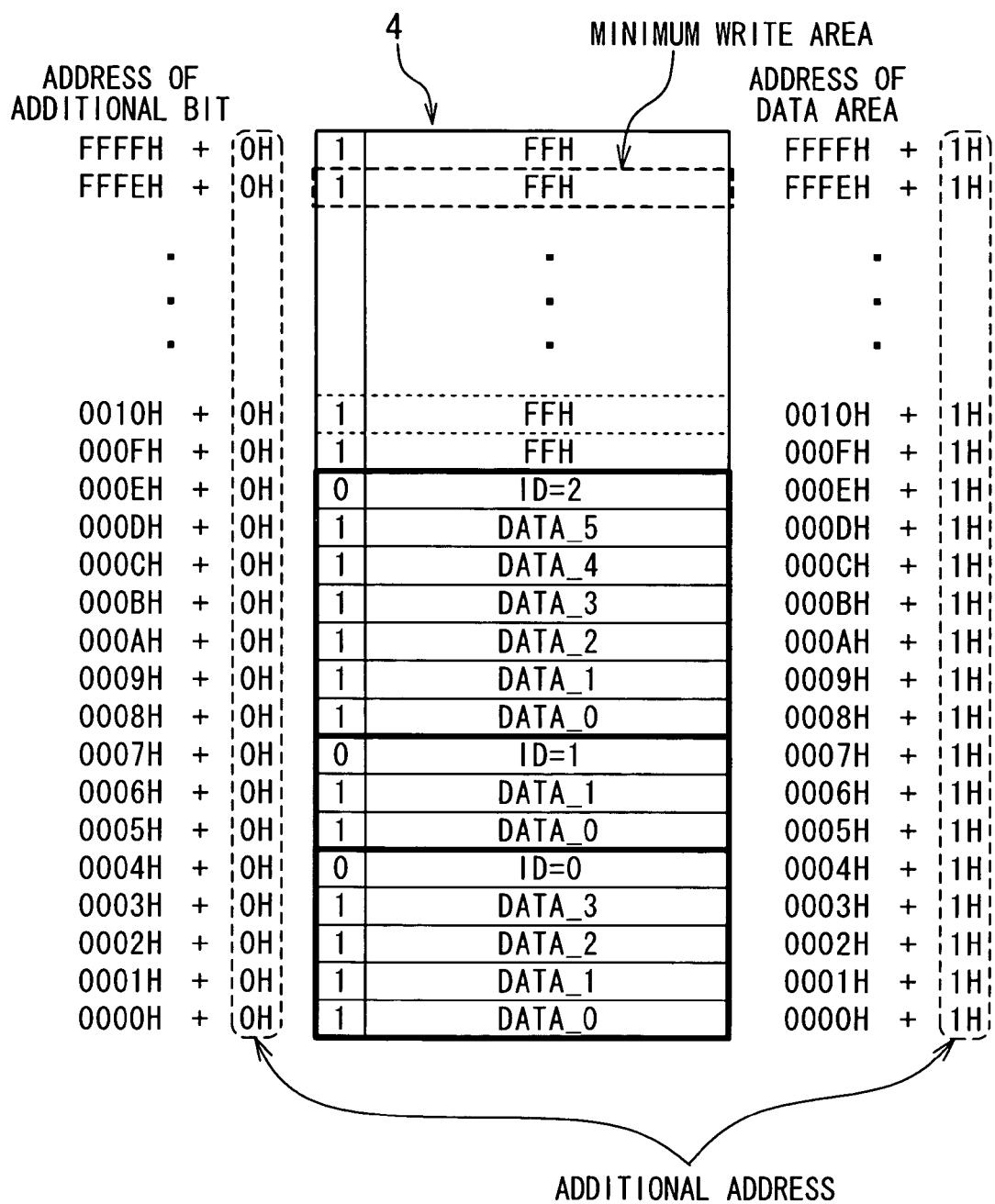
FIG. 15 is a diagram showing a modification example of assignment of addresses in the flash memory according to the first embodiment of the present invention.

As shown in FIG. 15, an address 0H designating the additional data area and an address 1H designating the data area may be prepared, and by using the two addresses, only the additional data may be read. It should be noted that as in the conventional example, when no write data group exists, the writing operation of data is started at the address 0000H. Though not described in the above description of blank search at the steps S4-1 to S4-4, when there is the blank area but there is no enough blank area to write all data contained in the data group, determination is made of whether or not a sufficient blank area exists in the flash memory 4, the whole flash memory 4 is erased while protecting necessary data groups (the data groups unrelated to this writing operation), and a process of rewriting operation of the necessary data to the flash memory 4 after the erasure and a process of writing the new data group are carried out.

Figure 16:
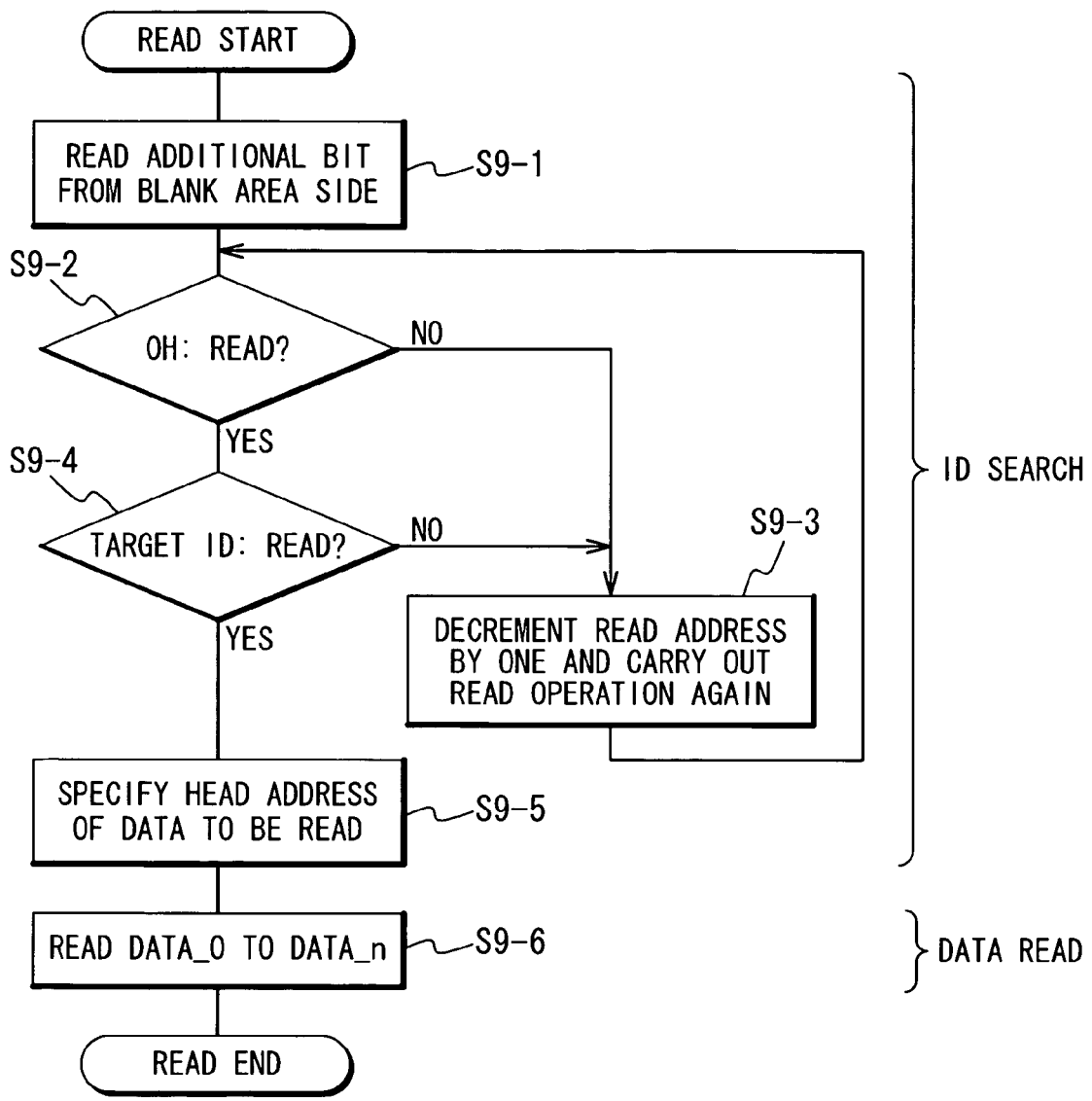
FIG. 16 is a flow chart showing a reading process flow according to the first embodiment of the present invention.

Next, the reading operation in the EEPROM emulation according to the first embodiment of the present invention is described. FIG. 16 is an operational flow chart showing the reading process according to the first embodiment. By searching the additional data of 0H, reading the ID of the data area stored at the same address as the searched additional data of 0H and determining whether or not the read ID is the ID associated with the plurality of data contained in the data group, the reading process is performed in two stages of ID search (steps S9-1 to S9-5) of identifying data and a reading operation (step S9-6) of reading the identified data. As a specific example, the reading operation of the data groups 0 and 1 from the flash memory in FIG. 13 will be described. Since the second writing operation of the data group 1 (data update) is performed in the flash memory in FIG. 13, the data group 1 (address 000FH to address 0011H) written last time is a valid data group and the data group 1 (address 0005H to address 0007H) written previously is dealt as an invalid data group.

At the step S9-1, starting from an address FFFFH as the last address in the flash memory 4, the CPU 2 reads data in the search direction of the address FFFFH→address FFFEH→address FFFDH→ . . . →address 0001H→address 0000H. Specifically, the CPU 2 outputs a read command and a read address (a first read address is the address FFFFH) to the memory control circuit 3. The memory control circuit 3 receives the read command from the CPU 2 and controls the reading operation of data of 9-bit length stored in tan address designated as a read address to the flash memory 4. The flash memory 4 outputs the read data of 9-bit length to the CPU 2. The CPU 2 determines and acquires the additional data among the data of 9-bit length read from the flash memory 4. This step is the same as the step S4-1 in the writing process.

At the step S9-2, the CPU 2 determines whether or not the acquired additional data is 0H. When the additional data of 0H is acquired, the process proceeds to the step S9-4. On the other hand, when the additional data of 1H is acquired, the process proceeds to the step S9-3.

At the step S9-3, when the additional data acquired by the CPU 2 at the step S9-2 is 1H, the CPU 2 decrements the read address by +1, the reading operation of the additional data is performed again and the process proceeds to the step S9-2. In FIG. 13, since the area of the address FFFFH to the address 0012H is an unused (blank) area and the read value of the additional data area is 1H in the erased state, the process at the steps S9-2 and S9-3 is repeated up to the address 0012H.

At the step S9-4, when the additional data acquired by the CPU 2 at the step S9-2 is 0H, the CPU 2 determines whether or not the data (ID) of 8-bit length read from the same address as the additional data of 0H is stored is the ID (the target ID) associated with the data in the data group to be read. When the read ID is the target ID, the process proceeds to the step S9-5. On the other hand, when the read ID is not the target ID, the process proceeds to the step S9-3 and the process at the steps S9-2 and S9-3 is repeated until the additional data of 0H is found again. In FIG. 13, when the data group to be read is the data group 0, the ID can be determined as the ID associated with the data to be read if the read ID is 0. At the step S9-2, the ID is read from the address 00011H and the value stored in the address 00011H is the ID=1. Thus, since the data group to be read is the data group 0, determination is made that this ID is not the target ID. Accordingly, the process proceeds to the step S9-3, the read address is decremented by +1 and the process at the steps S9-2 and S9-3 is repeated until the additional data of 0H is read from the flash memory 4. When the additional data of 0H is read, it is determined whether or not the ID stored at the same address in the data area is the target ID. Since the additional data of 0H is read from the address 000EH, address 0007H and address 0004H, and the address where the target ID (ID=0) is stored is the address 0004H, the process at the steps S9-2 and S9-4 is repeated up to the address 0004H. On the other hand, when the data group to be read is the data group 1, since the data stored at the address 00011H is ID=1, this ID can be determined as the target ID and the process proceeds to the step S9-5.

(S9-5) When the target ID can be identified at the step S9-4, the address obtained by decrementing the address where the target ID is read by +5 is identified as the head address of the data group to be read.

In FIG. 13, when the data group 0 is read, since determination is made that the target ID is stored at an address 0004H at the step S9-4, the address obtained by decrementing the address 0004H by +4 becomes an address 0000H. The address 0000H is identified as the head address of the data group. The reason why the address is decremented by +4 is that the data group 0 is formed of 5 data of the DATA_0 to DATA_3 and the ID, and the address where the DATA_0 is stored is the address obtained by decrementing the address where the ID is stored by +4

When the data group 1 is read, since the address 00011H is for the target ID, the address obtained by decrementing the address 0011H by +2 (the data group 1 is formed of 3 data) becomes the address 000FH. The address 000FH is identified as the head address of the data group 1 to be read.

(S9-6) The DATA_0 is read from the head address of the data that is identified at the step S9-5 and the DATA_1 to DATA_n are read sequentially while incrementing the address by +1.

In FIG. 13, by read the DATA_0 to DATA_3 from the addresses 0000H to 0003H, the data group 0 is read. By further read the DATA_0 and the DATA_1 from the address 000FH to address 0010H, the data group 1 is read.

The data group 1 has been updated in the flash memory 4 in FIG. 13. Data group concerning the data group 1 is stored at two locations and the valid data group is the data group written at later time, that is, closer to the blank area side. According to the method described at the steps S9-1 to S9-6, the additional bit of 0H (ID) is searched from the blank area side and when the target ID is identified, search of the data is finished. Thus, even when a plurality of data groups having the same ID are stored in the flash memory 4, the newest data group, that is, the valid data group can be read adequately. Also, in the example of reading process of the data group 1 as the data group in FIG. 13, the valid data group 1 (the address 000FH to address 0011H) is selected without selecting the invalid data group 1 (the address 0005H to address 0007H).

At the step S9-5, by using as a reference, the address where the ID of the data group to be read has been stored, the address where the DATA_0 of the data group to be read is identified. However, the following method may be adopted; the additional bit of 1H+DATA is read while sequentially decrementing the address by +1 from the address where the target ID is read and when the additional bit of 0H+ID is read, read of the data group to be read is finished. This method is effective when the number of data in the data group is not previously known.

In the writing process flow in FIG. 11 and the reading process flow in FIG. 16, the blank search and the ID search are performed from the address FFFFH (last address). As described in the conventional example, the search may be performed from the address 0000H (start address). However, in this case, in the writing process flow, the address obtained by incrementing by +1 the address where the additional bit of 0H is finally read is defined as the head address of the unused (blank) area. Also, in the reading process, the address where the target ID is finally read is identified as the ID of the valid data group.

As described above, in the present embodiment, the number of data forming the emulation write unit in EEPROM emulation need not be common to the emulation write unit having different IDs, that is, the data groups. Thus, the user can freely set the number of data contained in the data group. As a result, flexibility of design by the user is improved.

Furthermore, in the blank search steps of the writing process and the ID search of the reading process, since the ID can be searched merely confirming the additional bit, the method of detecting the ID is facilitated in comparison to the conventional art.

Second Embodiment

Figure 17:
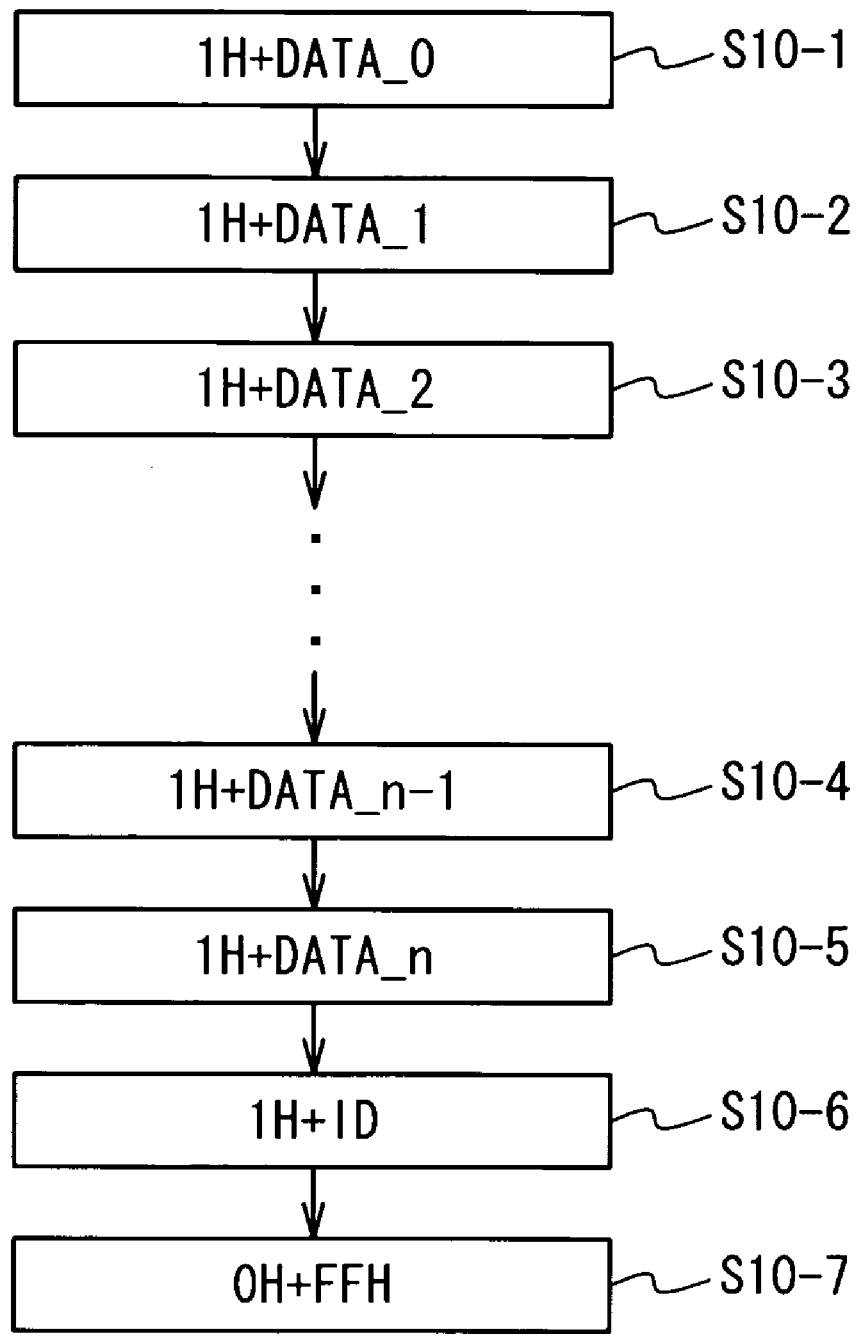
FIG. 17 shows a writing order of data in accordance with a second embodiment of the present invention.

FIG. 17 shows a writing order of data according to the second embodiment of the present invention. The writing order in writing the 0H+ID in the writing process in the second embodiment is different from that in the first embodiment in the following characteristic. Since matters other than the characteristic are common to the first and second embodiments, description thereof is omitted.

In the writing process in the EEPROM emulation, a plurality of data (DATA_0 to DATA_n, ID) and the additional data are written to the flash memory 4 for each emulation write unit (steps S4-4 and S4-5). The 0H+ID is finally written in the first embodiment (step S4-5), while writing is performed in two steps of 1H+ID→0H+FFH in the second embodiment.

In the flash memory 4, the erased state (for example, the state where there is no electric charge in the floating gate of a plurality of memory cells forming the flash memory 4) is set as 1H. When the additional data of 1H is written or data of FFH (11111111B) is written, no operation with respect to the memory cells forming the flash memory 4 is actually performed. That is, 1H+ID at the first step means a process of writing data only to the data area in the flash memory 4 and a writing process to the additional data area is not performed. On the contrary, 0H+FFH at the second step means a process of writing data only to the additional data area in the flash memory 4 and the writing process to the data area is not performed. In other words, the ID is written at the first step and the additional data of 0H is written at the second step, that is, at the end of a series of writing process.

As shown in FIG. 17, first, the 1H+DATA_0 is written (step S10-1). Next, the 1H+DATA_1 is written (step S10-2). Similarly, the 1H+DATA_2 to 1H+DATA_n are written (steps S10-3 to S10-5).

After writing of the data is ended, the 0H+ID is written. First, to write only the ID, the 1H+ID is written (step S10-6). Finally, to write the additional data of 0H, the 0H+FFH is written (step S10-7). As a result, writing of one data group formed of the additional data and the DATA_0 to DATA_n, ID is completed.

As described above, according to the present embodiment, by finally writing the additional data of 0H, it can be confirmed that no writing error due to power momentary stop or the like occurs. That is, when the finally written additional data of 0H is read properly, it can be determined that writing of the DATA_0 to DATA_n and the ID is normally performed.

The embodiments of the present invention have been described in detail. However, the present invention is not limited to the above-described embodiments and various modifications are possible. For example, the bit length of the additional data is not limited to 1-bit length and may be 2 bit-length or more. In the figures, the additional data is written so as to be located at the same address of the identified data of 8-bit length as a most significant bit of the data of 9-bit length. However, the present invention is not limited to this. Furthermore, although the additional data area and the data area are alternatively arranged in FIG. 15, any arrangement may be adopted. In the embodiments, the CPU 2 generates the write/read command to the memory control circuit 3 and the writing data and determines the read value. However, the memory control circuit 3 may perform all or part of these functions. On the contrary, a direct access control function of the memory control circuit 3 with respect to the flash memory 4 may be carried out by the CPU 2 without through the memory control circuit 3. Moreover, the first embodiment may be combined with the second embodiment.

What is claimed is:

1. An apparatus comprising:
a memory including a data area and an additional data area; and
a memory controller configured to access said data area and said additional data area respectively,
wherein said data area stores a first k-bit data (k is a natural number) and a second k-bit data,
wherein said additional data area stores a first additional m-bit data (m is a natural number) and a second additional m-bit data,
wherein at least a part of an address of said first additional data is the same as an address of said first data corresponding to said first additional data, and at least a part of an address of said second additional data is the same as an address of said second data corresponding to said second additional data,
wherein said first data, said second data, said first additional data, and said second additional data are included in a data group,
wherein said second data in said data group is an identification number (ID) for identifying said first data,
wherein said second additional data indicates that said second data corresponding to said second additional data is said ID,
wherein said first additional data indicates that said first data corresponding to said first additional data is not said ID, and
wherein the memory controller accesses said additional data area based on a first address, to read said second additional data, and accesses said data area based on a second address which is same as at least a part of said first address, to read said ID corresponding to said read second additional data.

2. The apparatus according to claim 1, wherein said memory stores a plurality of said data groups, wherein said first and second additional data are stored in same addresses as said first and second data respectively corresponding to said first and second additional data, said first and second additional data set to a particular value designate a boundary position for delineating one data group from adjacent data groups stored within said memory.

3. The apparatus according to claim 1, wherein said m is one.

4. The apparatus according to claim 1, wherein said memory stores a plurality of said data groups, and wherein said first data in one of said data groups is data updated from said first data in another of said data groups when said IDs are identical between one and another of said data groups.

5. The microcomputer according to claim 1, wherein said memory control circuit determines, in response to said ID, whether or not said ID is an ID corresponding to a read instruction; and
wherein said memory control circuit reads said first data identified by said ID when said ID is the ID corresponding to said read instruction.

6. The microcomputer according to claim 1, wherein said memory control circuit, based on a write instruction accessing sad memory, reads a data stored in said memory in an order of address, and
wherein said memory control circuit specifies, when the data read out comprises said second additional data, a write start address from which said memory control circuit starts to write a data corresponding to said write instruction.

7. The apparatus according to claim 1, wherein said data group is a first data group, and said ID is a first ID,
wherein said data area stores a k-bit third data and a k-bit fourth data, and said additional data area stores an m-bit third additional data and an m-bit fourth additional data, and said third data, said fourth data, said third additional data, and said fourth additional data are contained in a second data group,
wherein said fourth data is a second ID to identify said third data, and said fourth additional data indicates that said fourth data corresponding to said fourth additional data is said second ID, and said third additional data indicates that said third data corresponding to said third additional data is not said second ID, and
wherein said first data contains s (s is a natural number) k-bit data, and said third data contains t (t is not equal to s and is a natural number) k-bit data.

8. A microcomputer comprising:
a flash memory;
a central processing unit (CPU);
a memory control circuit configured to access, based on an instruction from said CPU, said flash memory in units of a data group comprising a first data, a first additional data, a second data, and a second additional data,
wherein said second data in said data group is an identification number (ID) for identifying said first data,
wherein said second additional data indicates that said second data corresponding to said second additional data is said ID of said data group and said first additional data indicates that said first data corresponding to said first additional data is not said ID of said data group,
wherein said memory control circuit is configured to write said first additional data to identify said first data when said first data is written in said flash memory, and is configured to write said second additional data to identify said second data when said second data is written in said flash memory, and
wherein said memory controller accesses said additional data area based on a first address to read said second additional data, and said memory controller accesses said data area based on a second address which is same as at least a part of said first address to read said ID corresponding to said read second additional data.

9. The microcomputer according to claim 8, wherein said CPU outputs said first data and said first additional data as a write data when instructing said memory control circuit to write said first data, and outputs said second data and said second additional data as the write data when instructing said memory control circuit to write said second data.

10. The microcomputer according to claim 8, wherein said CPU outputs a read instruction of said second data to said memory control circuit based on said second additional data.

11. The microcomputer according to claim 8, wherein said first and second additional data are stored in same addresses as said first and second data, respectively.

12. The microcomputer according to claim 8, wherein when said memory control circuit sets said first data, said memory control circuit sets the same value as a value indicating an erased state of said flash memory to said first additional data corresponding to said first data.

13. The microcomputer according to claim 8, wherein a bit length of each of said first and second additional data is one bit.

14. The microcomputer according to claim 8, wherein said flash memory stores a plurality of said data groups, and
wherein said first and second additional data set to a particular value designate a boundary position for delineating one data group from adjacent data groups stored within said flash memory.

15. The microcomputer according to claim 8, wherein said memory control circuit reads, in an order of address, based on a read instructions from said CPU, a data stored in said flash memory, and wherein said memory control circuit reads, in response to the data read out comprising said second additional data, said second data corresponding to said second additional data.

16. The microcomputer according to claim 8, wherein said memory control circuit determines, in response to said second data, whether said second data read out is an ID corresponding to said read instruction or not, and wherein said memory control circuit reads said first data identified by said second data when said second data is the ID corresponding to said read instruction.

17. The microcomputer according to claim 8, wherein said memory control circuit, based on a write instruction from said CPU, reads, in an order of address, a data stored in said flash memory, and wherein said memory control circuit specifies, when the data read out comprises said second additional data, a write start address from which said memory control circuit starts to write a data corresponding to said write instruction.

18. The microcomputer according to claim 17, wherein said memory control circuit reads the data stored in said flash memory in a direction which is opposite to a write access direction in said flash memory, and wherein said memory control circuit specifies an address in which a data is read immediately before said second additional data is read as said write start address when the data read out is said second additional data.

19. The microcomputer according to claim 8, wherein said memory control circuit accesses said flash memory by an EEPROM emulation, and wherein said data group is a data write unit in the EEPROM emulation.

20. The microcomputer according to claim 8, wherein said data group is a first data group, and said ID is a first ID, wherein said data area stores a k-bit third data and a k-bit fourth data, and said additional data area stores an m-bit third additional data and an m-bit fourth additional data, and said third data, said fourth data, said third additional data, and said fourth additional data are contained in a second data group, wherein said fourth data is a second ID to identify said third data, and said fourth additional data indicates that said fourth data corresponding to said fourth additional data is said second ID, and said third additional data indicates that said third data corresponding to said third additional data is not said second ID, and wherein said first data contains s (s is a natural number) k-bit data, and said third data contains t (t is not equal to s and is a natural number) k-bit data.

21. A memory control method comprising:

writing a plurality of data groups in a flash memory, each of said data groups comprising a first data, a first additional data to respectively identify said first data, a second data, and a second additional data to identify said second data; and accessing said flash memory in units of each said data group, wherein said second data in each said data group is an identification number (ID) for identifying said first data, wherein said second additional data indicates that said second data corresponding to said second additional data is said ID of said data group and said first additional data indicates that said first data corresponding to said first additional data is not said ID of said data group, and wherein said additional data area is accessed based on a first address to read said second additional data, and said data area is accessed based on a second address which is same as at least a part of said first address to read said ID corresponding to said read second additional data.

22. The memory control method according to claim 21, wherein said accessing comprises:

carrying out a first reading process in a first address direction to an additional data area of said flash memory in which said plurality of first additional data and said second additional data are stored;

carrying out a first determination of whether a data read out in said first reading process is said second additional data;

specifying an address to which said first reading process is performed immediately before said second additional data is read as a write start address upon said second additional data being read in said first determination; and writing said plurality of first data from said write start address in a second address direction, said second address direction being an opposite direction from said first address direction.

23. The memory control method according to claim 21, wherein said accessing comprises:

carrying out a reading process in a first address direction to an additional data area of said flash memory in which said plurality of first additional data and said second additional data are stored;

carrying out a first determination of whether a data read out in said reading process is said second additional data;

reading out said second data corresponding to said read out second additional data upon the read out data in said reading process being said second additional data;

carrying out a second determination of whether said read out second data is a target data;

specifying an address to which said reading process is scheduled immediately after said second additional data corresponding to said read out second data is read as a read start address upon said read out second data being said target data in said second determination; and reading out said plurality of first data from said read start address of said flash memory.

24. The memory control method according to claim 21, wherein said plurality of first additional data are stored in same addresses as said plurality of first data respectively corresponding to said plurality of first additional data and said second additional data is stored in same address as said second data corresponding to said second additional data, wherein said plurality of first additional data and said second additional data set to a particular value designate a boundary position for delineating one data group from adjacent data groups stored within said flash memory.

25. The memory control method according to claim 21, wherein when said first data is set, the same value as a value indicating an erased state of said flash memory is set to said first additional data corresponding to said first data.

26. The memory control method according to claim 21, further comprising:

determining a normality of said writing, wherein said writing writes said second additional data after completion of writing said plurality of first data, said plurality of first additional data and said second data, and wherein said determining a normality determines whether said writing is normally performed based on said second additional data.

27. The memory control method according to claim 21, wherein said flash memory includes a data area and an additional data area,
wherein said data group is a first data group, and said ID is a first ID,
wherein said data area stores a k-bit third data and a k-bit fourth data, and said additional data area stores an m-bit third additional data and an m-bit fourth additional data, and said third data, said fourth data, said third additional data, and said fourth additional data are contained in a second data group,
wherein said fourth data is a second ID to identify said third data, and said fourth additional data indicates that said fourth data corresponding to said fourth additional data is said second ID, and said third additional data indicates that said third data corresponding to said third additional data is not said second ID, and
wherein said first data contains s (s is a natural number) k-bit data, and said third data contains t (t is not equal to s and is a natural number) k-bit data.

* * * * *